PRINTED WIRING BOARD REPAIR APPARATUS

Filed May 18, 1960

INVENTORS
RALPH E. USHER
JOHN J. CONWAY
FRANCIS E. GOODNESS
BY Vernon F. Kalb
ATTORNEY July 17, 1962 R. E. USHER ETAL 3,045,095

PRINTED WIRING BOARD REPAIR APPARATUS

Filed May 18, 1960 2 Sheets-Sheet 2

INVENTORS
RALPH E. USHER
JOHN J. CONWAY
FRANCIS E. GOODNESS

BY Vernon F. Kalb
ATTORNEY

United States Patent Office 3,045,095
Patented July 17, 1962

3,045,095

PRINTED WIRING BOARD REPAIR APPARATUS

Ralph E. Usher, Ilion, John J. Conway, Clinton, and Francis E. Goodness, Utica, N.Y., assignors to General Electric Company, a corporation of New York Filed May 18, 1960, Ser. No. 29,978
3 Claims. (Cl. 219—10.79)

The invention relates to printed wiring board repairing apparatus and more particularly to apparatus for soldering and de-soldering components on a printed wiring board.

Complex printed wiring board assemblies may be found to be defective for any one of many reasons; however, the cost of trouble shooting in an attempt to find the difficulty is usually prohibitive. In those instances where a single component is known to be defective, the removal of that particular component presents the danger of injury to the adjacent components and to the printed wiring board itself; further, the removal of the component from the printed wiring board is a time-consuming and difficult task. Therefore, the usual alternative is to discard the printed wiring board assembly and salvage the components mounted thereon.

The apparatus of the present invention overcomes the difficulties of the prior art by providing joint heating and solder-removing cycles whereby a solder joint may be heated and the solder removed quickly and efficiently. The apparatus of the subject invention also enables a component to be quickly soldered to a printed wiring board with a minimum of time and effort.

It is therefore an object of the invention to provide an apparatus for the efficient removal of the components from a printed wiring board assembly.

It is also an object of the invention to provide an apparatus which facilitates removal of a specific component from a printed wiring board assembly.

It is also an object of this invention to provide an apparatus for heating a printed wiring board junction to the proper temperature for the application of solder.

It is a further object of this invention to provide an apparatus which may be employed to solder or de-solder a printed wiring board assembly automatically or, at the selection of the operator, manually.

Briefly stated, in accordance with one aspect of the invention, a radio frequency induction heating coil is provided in such a configuration that the high frequency energy therefrom is focused in an area only of sufficient size to accommodate a printed wiring board solder joint. This area of maximum energy concentration is positioned in a convenient location slightly above the surface of a work table and a beam of light is directed on the area to facilitate the positioning of the joint to be heated. The solder joint on the printed wiring board is held in the area of maximum energy concentration until the solder is raised to the proper temperature. A cylindrical tube, supported adjacent the area of maximum energy concentration, and made of a material unaffected by the high frequency energy, is positioned so that the solder joint held against one end thereof communicates with a vacuum chamber for drawing off melted solder. The vacuum chamber is connected to a vacuum pump which is actuated when the temperature of the solder reaches the correct value. A control circuit is provided which, when automatic operation is desired by the operator, will energize the radio frequency heating coil until the solder reaches the proper temperature, and will then actuate the vacuum pump to cause the melted solder to be withdrawn from the joint. In some instances, it may be desirable to sequence the apparatus manually; the manual operation of the apparatus is facilitated by merely setting the proper switches. To provide for the soldering of printed wiring board joints, the operator need only select the proper switch settings, thus enabling the apparatus of the invention to be utilized as a soldering machine.

The invention both as to its organization and method of operation together with further objects and advantages thereof may best be understood by reference to the following description taken in connection with the accompanying drawings in which.

Figure 1:
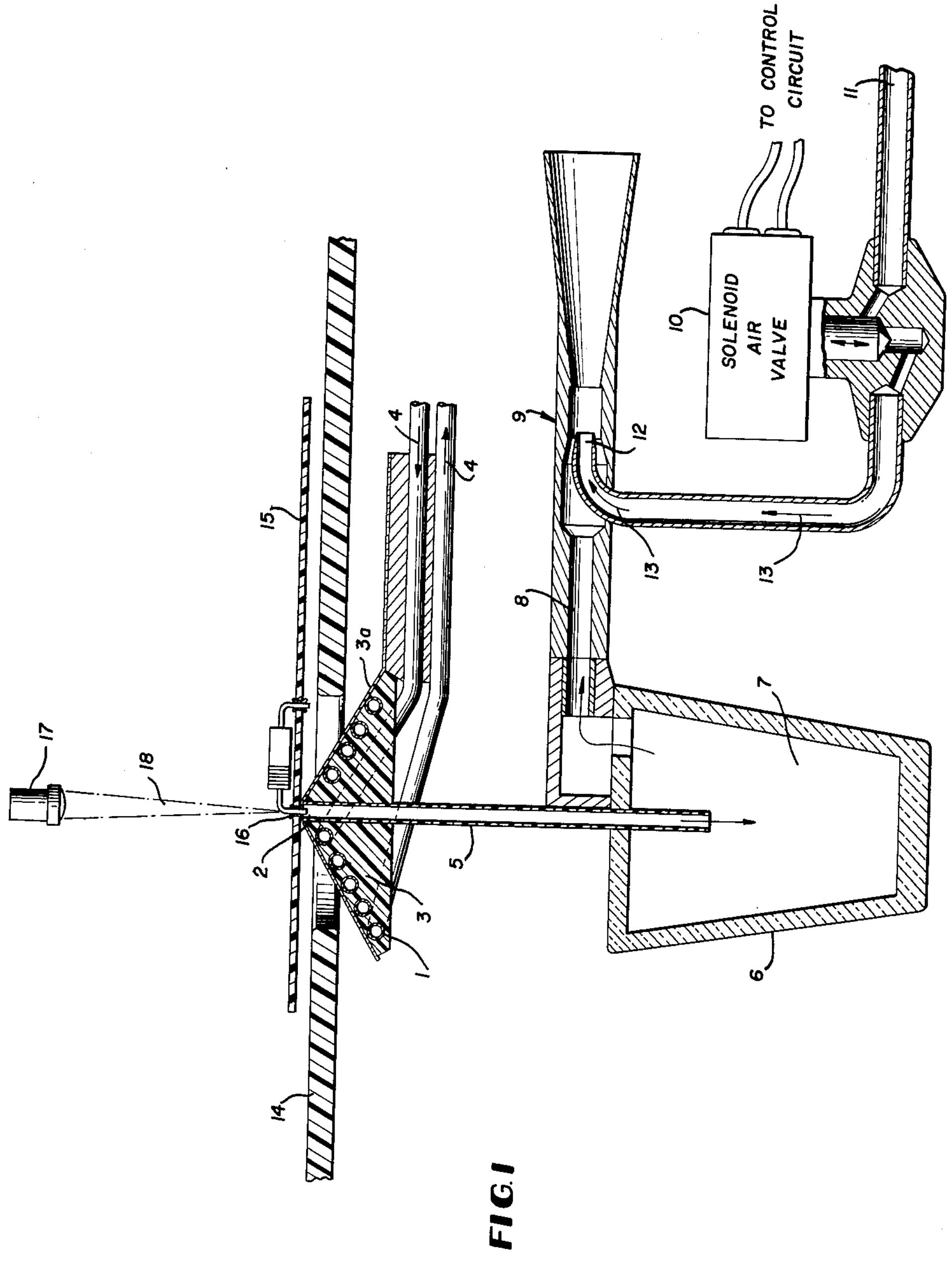
FIG. 1 shows a soldering and de-soldering apparatus incorporating the features of the invention.

Referring to FIG. 1, a focusing heat source which, as shown, is a radio frequency heating coil 1 is wound in the form of a cone to focus the energy in the general area of the apex 2. The coil may be imbedded in a suitable material, such as an epoxy resin 3, carried by the supporting structure 3*a*, to protect the coil and increase the rigidity of the structure. The coil 1 which may be formed of hollow tubing is connected to an RF oscillator (not shown in FIG. 1), and may be provided with cooling water passed through the tubing as shown by the arrows 4 to increase the power handling capacity. A solder extraction tube 5, having one end thereof adjacent to the apex 2 of the structure 3*a* for withdrawing molten solder, extends through the eye of the coil 1, through the epoxy resin 3, and to a solder receptacle 6 supported in any suitable manner (not shown). The extraction tube 5 is made of a suitable material, such as (for example) polytetrafluoroethylene, which is not heated or otherwise affected by the intense high frequency field existing in the coil apex. The solder receptacle 6 includes an evacuation chamber 7 and is connected by a passageway 8 to a vacuum-creating means such as a jet pump indicated generally at 9. A solenoid air valve 10 provides the actuating means for the jet pump 9 by connecting a source of air 11 to the jet pump inlet 12. The air flow, indicated by the arrows 13, induces a partial evacuation of the chamber 7 as may be well understood.

The apparatus thus described is mounted so that the apex of the supporting structure 3*a* with the conical heating coil 1 and extraction tube 5 protrudes slightly above the surface of the aperture of a worktable 14. Thus, a printed wiring board, such as shown at 15, may be positioned so that a solder joint 16 is in contact with the extraction tube 5 in the area of maximum energy concentration. To enable the solder joint 16 to be positioned correctly in the area of maximum energy concentration, a light source 17 is mounted above the surface of the worktable 14 and is designed to focus a beam of light 18 directly on the cone apex; therefore, by positioning the solder joint 16 directly in the beam of light 18 the joint will be positioned correctly with respect to the extraction tube 5 and the heating coil 1. The embodiment shown in FIG. 1 has been chosen for its simplicity of description; however, it will be understood by those skilled in the art that any type of evacuation system may be used and a plurality of work coils may be positioned to accommodate several solder joints simultaneously.

The operation of the embodiment shown in FIG. 1 may be described as follows:

The printed wiring board 15 having a solder joint 16 to be de-soldered is positioned beneath the light source 17 so that the solder joint 16 is in the beam of light 18. The solder joint 16 is thus correctly positioned with respect to the apex 2 of the conical heating coil 1. The heating coil is then energized, and the joint 16 heated until the melting point of the solder is reached, whereupon the solenoid air valve 10 is then energized, thereby actuating jet pump 9 and causing partial evacuation of the chamber 7. The melted solder is thus drawn from the joint 16 through the extraction tube 5 and deposited in the solder receptacle 6. The sequence of operations may be manual or automatic as desired by the operator and as will be described in connection with FIG. 2.

Figure 2:
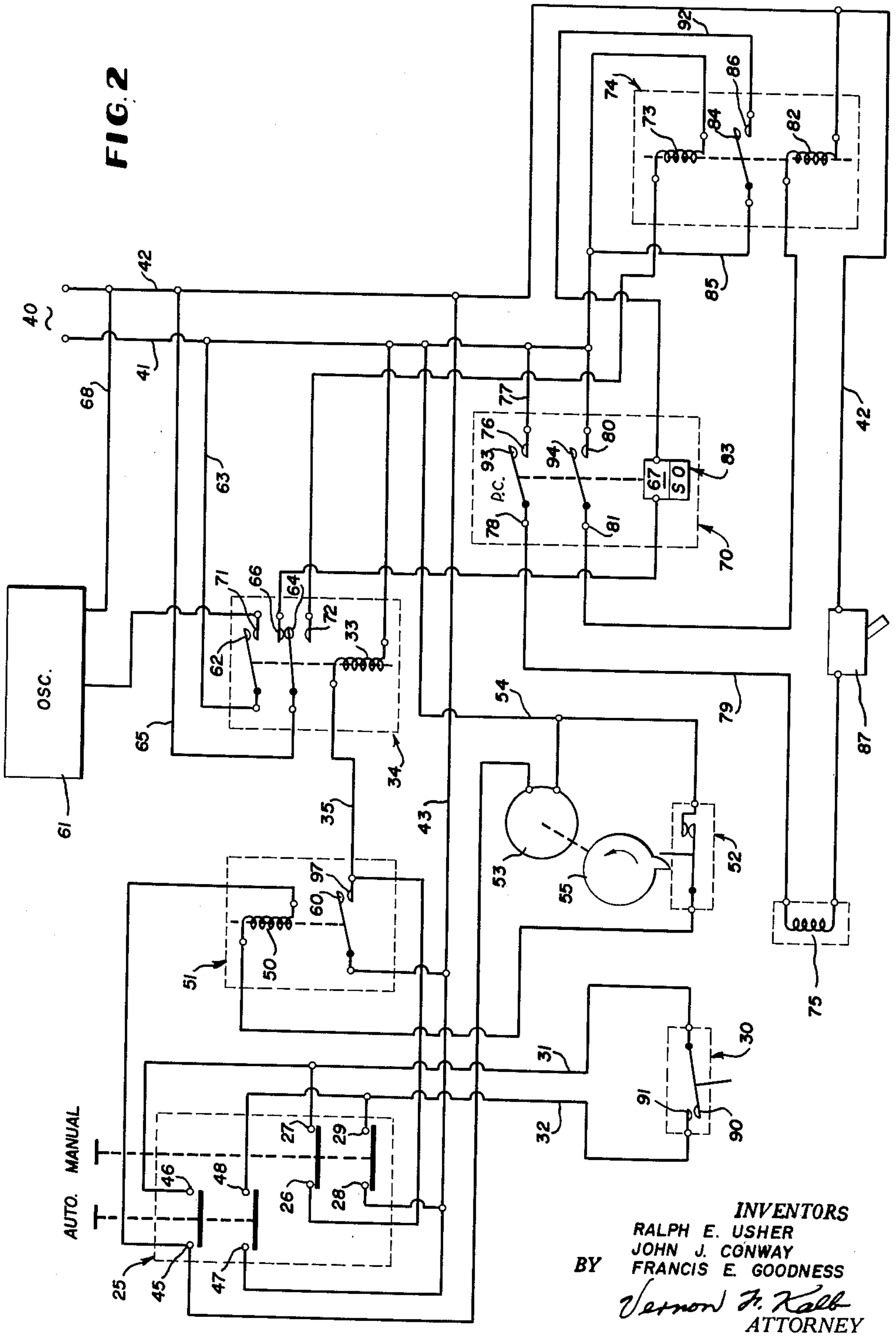
FIG. 2 shows an electrical circuit which may be used to properly sequence the apparatus of FIG. 1.

Referring to FIG. 2, a selector switch 25 is provided for permitting the operator to choose automatic or manual sequencing of the apparatus of FIG. 1. The selector switch 25 includes a "manual" switch having contacts 26, 27, 28 and 29. A foot switch 30 for starting the sequencing is connected to terminals 27 and 29 by conductors 31 and 32 respectively. Contact 26 is joined to one terminal of relay coil 33 of relay 34 through conductor 35, and the other terminal of relay coil 33 is joined to the power source 40 through conductor 41. Contact 28 is joined to the other side of the power source 40 through conductors 42 and 43.

Selector switch 25 also has a set of contacts designated "auto" for permitting automatic sequencing. These contacts are shown at 45, 46, 47 and 48. Contact 45 is joined to one terminal of relay coil 50 of the relay 51. The second terminal of the relay coil 50 is joined to the timer switch 52. The contact 45 is also joined to one terminal of the timer motor 53 which provides the correct timing for the heating cycle of the radio frequency heating coil of FIG. 1. The timer switch 52, and the timer motor 53 are joined to the power source 40 through conductor 54. Contact 46 of the selector switch 25 is joined to the foot switch 30 through the conductor 31, the opposite terminal of which is joined to contact 48 through conductor 32. Contact 47 of the selector switch 25 is connected to the contactor 60 of the relay 51, and is also connected to the power source 40 through conductors 43 and 42. Relay 34, when actuated, provides the energization for the power supply of the oscillator 61. The relay 34 includes contact 62 joined to the power source 40 through conductors 63 and 41, contact 64 connected to the opposite terminal of the power source 40 through conductors 65 and 42, and contact 66 joined to relay coil 67 of a slow operate relay or pneumatic delay switch 70. Relay 34 also has a contact 71 connected to the oscillator 61 and a contact 72 connected to the relay coil 73 of a latching relay 74. The slow operate relay or pneumatic delay switch 70 provides the means for energizing the solenoid coil 75 of the air valve of FIG. 1 (not shown in FIG. 2. The pneumatic delay switch 70 includes contact 76 connected to the power source 40 through conductor 77, and terminal 78 joined to one terminal of the solenoid coil 75 through conductor 79. The pneumatic delay switch 70 also includes contact 80 which is connected to the relay coil 73 of the latching relay 74, and terminal 81 connected to the second relay coil 82 of the latching relay 74. The contact arrangement of the pneumatic delay switch 70 is a "preliminary contact" type, that is, contacts 78 and 93 are closed upon energization of coil 67, and contacts 80 and 94 then close a time interval thereafter depending on the desired delay. The delay in closing contacts 80 and 94 may be provided by a simple spring loaded bellows (not shown), indicated generally at 83, including valving means (not shown) to allow rapid air intake and controlled bleed-off. The adjustable delay or bleed-off may be a needle valve which offers a partial restriction to the air flow, as may be well known.

The latching relay 74 includes two relay coils 73 and 82 which are wound in opposing fashion, that is, when selectively energized, they will attract the armature toward the respective energized coil and away from the opposing non-energized coil. Latching relay 74 also includes contact 84 which is joined to the power source 40 through conductors 85 and 41, and contact 86 which is connected to the relay coil 67 of the pneumatic delay switch 70. The solenoid coil 75 is joined through conductor 79 to the pneumatic delay switch 70, and to the power source 40 through air switch 87 and conductor 42.

The operation of the circuit of FIG. 2 will now be described. Assuming the operator desires manual sequencing, contacts 26 and 27, and contacts 28 and 29 of selector switch 25 are closed by the operator through the actuation of the "manual" switch. The air switch 87 is then placed at the "on" position with contacts closed, and the foot switch 30 is depressed thereby closing contacts 90 and 91. A circuit is then completed from the power source 40 through conductor 42, conductor 43 to contact 28, then to contact 29 and the foot switch 30. Current flows through the foot switch 30 to conductor 31 to contacts 27 and 26. From contact 26, the current follows conductor 35 through relay coil 33 of the relay 34, and to the opposite terminal of the power source 40 through conductor 41. The relay 34 is thus energized, and the contacts 62 and 64 are forced into engagement with contacts 71 and 72 respectively. With the relay 34 actuated, the oscillator 61 is energized by the current flowing from the power source 40 through conductors 41 and 63 through the contacts 62 and 71 to the oscillator, and back again through conductor 68 to the power source 40. Current is also permitted to flow through conductor 65 through now closed contacts 64 and 72 to the relay coil 73 of the latching relay 74. With the coil 73 of the latching relay 74 energized, the contacts 84 and 86 are forced into engagement thereby preparing a circuit, including coil 67 of pneumatic delay switch 70, for energization upon completion of the heating cycle. Thus far, the oscillator has been energized, and the heating coil of FIG. 1 has begun the heating of the solder joint.

The circuit remains in this state until the operator, by visual inspection, determines that the solder is in the proper molten state. At that time, the operator releases the foot switch 30 thereby opening contacts 90 and 91, which in turn, de-energizes the relay 34 causing contacts 64 and 66 to come into contact and open the circuit to relay coil 73 of the latching relay 74. A circuit is therefore completed from the power source 40 through conductor 42 and conductor 65, to contacts 64 and 66 of relay 34 to the relay coil 67 of the pneumatic delay switch 70. The other side of the relay coil 67 is joined to the opposite side of the power source 40 through conductor 92 and through the previously prepared circuit of closed contacts 84 and 86, and conductors 85 and 41. The heating cycle is thus at an end, and the molten solder must now be removed. The energization of the solenoid coil 75 of the air valve of FIG. 1 is provided by the pneumatic delay switch 70. With the relay coil 67 of the pneumatic delay switch actuated, contacts 76 and 93 are closed, thus completing the circuit from the power source 40 through conductor 77, contacts 76 and 93, conductor 79, solenoid coil 75, and air switch 87 to conductor 42. The solenoid coil 75, having been energized, permits the vacuum generating means of FIG. 1 to draw off the molten solder from the solder joint. The energization of the solenoid coil 75 is timed by the pneumatic delay switch 70. When the relay coil 67 of the pneumatic delay switch 70 is energized, the contact 93 is forced into engagement with contact 76 and the contact 94 attempts to follow the contact 93; however, the movement of contact 94 is retarded by the delay mechanism 83 which prohibits the rapid closing of contacts 80 and 94. Therefore, after a measured time delay, for example one second, the contact 94 engages contact 80 thereby completing a circuit from the power source 40 through the contacts 80 and 94 to the relay coil 82 of the latching relay 74. The contacts 84 and 86, previously in engagement, are thus parted, and the circuit to the relay coil 67 of the pneumatic delay switch 70 is broken. With the relay coil 67 de-energized, the contact 93 will disengage contact 76 thereby opening the circuit to the solenoid coil 75. The circuit of FIG. 2 has thus provided a manually controlled heating cycle which, when energized by the operator, automatically provides an evacuation cycle which is pneumatically controlled and will de-energize itself after the desired time delay. With the circuit thus de-energized, it is then ready for the operator to start a like sequence.

For automatic operation, the operator closes the "auto" contacts 45, 46, 47 and 48. The operator then depresses the foot switch which energizes the relay 34 thereby closing contacts 62 and 71 of the relay 34 to provide power to the oscillator 61. Simultaneously, the relay coil 50 of the relay 51 is energized, thereby closing contacts 60 and 97. The timer motor 53 connected to contact 45 of selector switch 25, is also energized and causes the cam 55 to rotate as indicated by the arrow. When the timer motor 53 has rotated through the desired angle (the timer may be of the adjustable type wherein the number of degrees of rotation per cycle may be set, and the timer will reset itself after completion of one cycle), the timer cam 55 opens the timer switch 52 which therefore opens the circuit of the relay coil 50. With the relay coil 50 de-energized, the contact 60 will drop out of engagement with contact 97, and the relay coil 33 of the relay 34 will thereby become de-energized. When the relay coil 33 of the relay 34 is de-energized, and the contacts 62 and 66 return to the position shown in FIG. 2, the oscillator 61 is de-energized, and the heating cycle is completed. The extraction cycle then proceeds as explained above for manual operation. Therefore, the circuit of FIG. 2 has provided an adjustable energization time for the heating coil of FIG. 1, and upon de-energization of the coil, the evacuation cycle is begun. Upon completion of the evacuation cycle, and the withdrawal of the molten solder from the joint, the circuit is de-energized and readied for the instigation of a second cycle by the operator.

To solder, either manually or automatically, the operator need only place air switch 87 in the "off" position thereby inhibiting the energization of the solenoid coil 75. The operator then may proceed as with the de-soldering sequence, which thereby provides heating without an extraction cycle.

It will be obvious to those skilled in the art that many variations of the apparatus and circuitry disclosed and described herein may be made without departing from the spirit and scope of the invention, and therefore this invention is to be considered as limited only in accordance with the features thereof as set forth in the claims appended hereto.

What is claimed as new and desired to be secured by Letters Patent of the United States is:

1. Apparatus for de-soldering a soldered terminal mounted on a terminal board comprising, an oscillator for generating radio frequency energy, a conical heating coil connected to said oscillator for focusing said energy into an area the size of the soldered terminal at the apex of said coil, a tube formed of an insulating material positioned concentrically with said conical heating coil and having one end terminating at the apex thereof, said coil and said tube being embedded in a cast insulating material to position and secure the same in fixed relationship with respect to each other, and means connected to said tube for establishing a vacuum therein for removing melted solder through said tube.

2. Apparatus for de-soldering a soldered terminal mounted on a terminal board comprising, an oscillator for generating high frequency energy, a conical heating coil connected to said oscillator for focusing said energy into an area substantially the size of the terminal to be de-soldered, a focusing light source positioned substantially on the axis of said conical heating coil and being disposed in spaced confronting relationship with respect to the apex thereof for focusing a beam of light into the area of heat energy concentration to indicate the position thereof, a nonconductive tube providing a passage extending from said area of heat energy concentration, and means for establishing a partial vacuum in said passage for removing melted solder.

3. Apparatus for de-soldering a soldered terminal mounted on a terminal board comprising, an oscillator to be energized for generating high frequency energy, a conical heating coil connected to said oscillator for focusing said energy into an area the size of the terminal to be heated, a tube formed of a nonconductive material positioned concentrically with respect to said conical heating coil and having an end terminating at the apex thereof, means for establishing a vacuum within said passage for the removal of melted solder from such terminal, and means for automatically sequencing the energization of the oscillator and said vacuum-establishing means.

References Cited in the file of this patent

UNITED STATES PATENTS

| | | |
|---|---|---|
| 2,314,865 | Bierwirth | Mar. 30, 1943 |
| 2,609,778 | Bleam et al. | Sept. 9, 1952 |
| 2,709,743 | Mitchell | May 31, 1955 |
| 2,745,939 | Lenk | May 15, 1956 |
| 2,882,380 | Campo | Apr. 14, 1959 |
| 2,955,188 | Campo | Oct. 4, 1960 |